US010336905B2

(12) United States Patent
Tang et al.

(10) Patent No.: US 10,336,905 B2
(45) Date of Patent: Jul. 2, 2019

(54) ORGANIC SILICON RESIN COMPOSITION, WHITE PREPREG AND WHITE LAMINATE USING SAME

(71) Applicant: SHENGYI TECHNOLOGY CO., LTD., Guangdong (CN)

(72) Inventors: Guofang Tang, Guangdong (CN); Suwen Ye, Guangdong (CN); Peng Sun, Guangdong (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 6 days.

(21) Appl. No.: 15/539,479

(22) PCT Filed: Jun. 1, 2015

(86) PCT No.: PCT/CN2015/080533
§ 371 (c)(1),
(2) Date: Jun. 23, 2017

(87) PCT Pub. No.: WO2016/101537
PCT Pub. Date: Jun. 30, 2016

(65) Prior Publication Data
US 2018/0016436 A1 Jan. 18, 2018

(30) Foreign Application Priority Data
Dec. 25, 2014 (CN) .......................... 2014 1 0829372

(51) Int. Cl.
C08L 83/04 (2006.01)
C08K 3/10 (2018.01)
C08K 3/22 (2006.01)
C08K 3/36 (2006.01)
H01L 23/29 (2006.01)
B32B 15/08 (2006.01)
C08K 5/00 (2006.01)
C09J 183/04 (2006.01)
C08K 3/01 (2018.01)
C08K 5/098 (2006.01)
C08K 5/17 (2006.01)
C08K 5/5398 (2006.01)
C08K 5/5399 (2006.01)
C08K 5/5415 (2006.01)

(52) U.S. Cl.
CPC .............. C08L 83/04 (2013.01); B32B 15/08 (2013.01); C08K 3/01 (2018.01); C08K 3/10 (2013.01); C08K 3/22 (2013.01); C08K 3/36 (2013.01); C08K 5/00 (2013.01); C09J 183/04 (2013.01); H01L 23/29 (2013.01); C08K 5/098 (2013.01); C08K 5/17 (2013.01); C08K 5/5398 (2013.01); C08K 5/5399 (2013.01); C08K 5/5415 (2013.01); C08K 2003/2227 (2013.01); C08K 2003/2237 (2013.01); C08K 2003/2241 (2013.01); C08K 2003/2296 (2013.01); H01L 2924/0002 (2013.01)

(58) Field of Classification Search
None
See application file for complete search history.

(56) References Cited

U.S. PATENT DOCUMENTS

| 3,018,270 A * | 1/1962 | Toogood | C08G 77/16 528/10 |
| 4,385,158 A * | 5/1983 | Mikami | C08G 59/1472 525/476 |
| 4,657,986 A * | 4/1987 | Isayama | C08G 59/4085 525/100 |
| 5,280,098 A * | 1/1994 | Witucki | C09D 183/06 525/100 |
| 5,482,992 A * | 1/1996 | Kimura | C08G 65/336 524/588 |
| 7,732,496 B1 * | 6/2010 | Leventis | C04B 35/14 423/335 |
| 9,663,664 B2 * | 5/2017 | Tasaki | C09D 11/102 |
| 2001/0053447 A1 | 12/2001 | Takano et al. | |
| 2005/0189877 A1 * | 9/2005 | Ishida | H01J 9/266 313/512 |
| 2005/0215668 A1 * | 9/2005 | Scholz | C08K 9/04 523/216 |
| 2006/0270786 A1 | 11/2006 | Shimiz et al. | |
| 2007/0088123 A1 * | 4/2007 | Futatsumori | C08L 83/04 524/863 |

(Continued)

FOREIGN PATENT DOCUMENTS

CN 101381515 A 3/2009
CN 101565600 A 10/2009

(Continued)

OTHER PUBLICATIONS

Patent Cooperation Treaty (PCT), International Search Report and Written Opinion for Application PCT/CN2015/080533 filed Jun. 1, 2015 dated Sep. 2, 2015, International Searching Authority, CN.

Primary Examiner — Robert S Loewe
(74) Attorney, Agent, or Firm — McDonald Hopkins LLC

(57) ABSTRACT

Provided are an organic silicon resin composition, prepreg and laminate using the same. The organic silicon resin composition glue solution contains a condensation silicon resin, a catalyst, an auxiliary agent, a white filler and a solvent as necessary components, and is impregnated in a reinforced material such as a sheet-like fiberglass fiber base material and then dried to prepare the prepreg. The prepreg has a net structure via crosslinking of the silicon resin using a condensation reaction. Since the organic silicon resin has ultrahigh heat resistance and yellowing resistance, the present invention applies the silicon resin to a white LED copper-clad laminate instead of a traditional organic resin, satisfying the demand for high heat resistance, and replacing the ceramic substrate to be a new heat-dissipating substrate base material.

5 Claims, No Drawings

(56) References Cited

U.S. PATENT DOCUMENTS

| | | | |
|---|---|---|---|
| 2009/0171013 A1* | 7/2009 | Taguchi | C08K 3/22 524/588 |
| 2009/0239997 A1 | 9/2009 | Taguchi et al. | |
| 2009/0304961 A1* | 12/2009 | Taguchi | C08L 83/04 428/35.7 |
| 2009/0306263 A1* | 12/2009 | Taguchi | C08L 83/04 524/404 |
| 2010/0044090 A1* | 2/2010 | Endo | C08G 59/08 174/260 |
| 2010/0081748 A1* | 4/2010 | Taguchi | C08L 83/04 524/433 |
| 2010/0273927 A1* | 10/2010 | Taguchi | C08L 83/04 524/433 |
| 2010/0292428 A1* | 11/2010 | Meador | C07F 7/21 528/28 |
| 2010/0326699 A1* | 12/2010 | Greyling | C09D 183/04 174/137 B |
| 2012/0237751 A1* | 9/2012 | Kotake | B32B 5/26 428/221 |
| 2012/0247820 A1* | 10/2012 | Miyatake | C08L 83/06 174/258 |
| 2013/0037310 A1* | 2/2013 | Kimura | C08J 5/24 174/251 |
| 2013/0109785 A1* | 5/2013 | Endo | C08K 3/22 523/436 |
| 2013/0330563 A1* | 12/2013 | Kotake | C08G 73/125 428/447 |
| 2014/0194019 A1 | 7/2014 | Greer et al. | |

FOREIGN PATENT DOCUMENTS

| | | |
|---|---|---|
| CN | 101712799 A | 5/2010 |
| CN | 101724268 A | 6/2010 |
| CN | 101870817 A | 10/2010 |
| CN | 102181264 A | 9/2011 |
| EP | 2075280 A1 | 7/2009 |
| EP | 2174984 A1 | 4/2010 |
| EP | 2253671 A1 | 11/2010 |
| JP | 2007012876 A | 1/2007 |
| JP | 2008025581 A | 2/2008 |
| JP | 2008095002 A | 4/2008 |
| JP | 2010106243 A | 5/2010 |
| JP | 2010254825 A | 11/2010 |
| JP | 2013095862 A | 5/2013 |
| JP | 2013107984 A | 6/2013 |
| JP | 2014136387 A | 7/2014 |
| KR | 20040035573 A | 4/2004 |

\* cited by examiner

ORGANIC SILICON RESIN COMPOSITION, WHITE PREPREG AND WHITE LAMINATE USING SAME

CROSS-REFERENCE TO RELATED APPLICATION

This application is a 35 U.S.C. 371 national stage filing of PCT Application No. PCT/CN2015/080533, filed on Jun. 1, 2015, which claims priority to Chinese Patent Application No. 201410829372.5, filed on Dec. 25, 2014 each of which are incorporated herein in their entirety by reference.

TECHNICAL FIELD

The present invention relates to an organosilicone resin composition obtained by using a condensation type silicone resin in place of a traditional organic resin and a white prepreg, a laminate and a copper-clad laminate using the same, which have high heat resistance, high reflection, excellent heat aging resistance and UV-irradiation aging resistance.

BACKGROUND ART

Light-emitting diode (LED) is a semiconductor device which can directly convert the electric energy into the photoenergy, and has the characteristics of energy saving, environmental protection and long lifetime, etc., the rapid development and extensive use of LED will lead to a revolution in the field of lighting.

During the processing and use of the PCB substrate installed with LED, since the LED has light-emitting characteristics, the optical reflectivity of the surface of the resin layer should be as large as possible; and the copper-clad laminate for printed circuit board thereof undergoes a variety of heating processes during the manufacturing process of the chip LED; and when the chip LED is in use, the LED element itself will generate heat, and the LED will also generate heat stress when emitting light, therefore the white copper-clad laminate used for LED is required to have high heat resistance.

In addition to the general performance requirements of the conventional CCL are required, the white copper-clad laminate for LED is also required to have some special performances. The white copper-clad laminate for LED is not only required to have high initial state reflectivity, but also a characteristic of long-term retention of the reflectivity (including non-discoloration of the board under high-heat radiation, and non-discoloration of the board under the long-term ultraviolet irradiation), meanwhile it is also required to have high heat resistance, and high rigidity at high temperatures. To make the white CCL obtain high ultraviolet discoloration resistance and heat discoloration resistance, it mainly depends on the improvement or innovation in the performance of the various components in the resin composition to achieve this special performance.

Both organic groups and inorganic groups are contained in the structure of the organosilicone resin, such special composition and molecular structure make the silicone resin have both the characteristics of organics and the functions of inorganics. The organosilicone resin is a thermosetting resin, when it is under the thermal oxidation at high temperature, only the cleavage of the organic radicals on the side chains will occur, and they will be decomposed to escape their oxides, while the silicon-oxygen bond on the main chain is rarely destroyed, ultimately a polymer in a form of —O—Si—O— will be generated, the bond energy of their Si—O silicon-oxygen bond is 373 KJ/mol, thus their heat resistance is far superior to the general organic resins. The ultraviolet light is hardly absorbed by methylsiloxane, and siloxane containing $PhSiO_{1.5}$ or $Ph_2SiO$ chain link only absorbs light with a wavelength of 280 nm or less, therefore the organosilicone resin has a very good weather resistance. In addition, the organosilicone resin has prominent weather resistance, which is beyond the reach of any kind of organic resins, even if it is irradiated under intense ultraviolet light, the silicone resin has very superior yellowing resistance.

Therefore, compared with the general resins, the organosilicone resin has unique properties such as excellent high and low temperature resistance, weather aging resistance, electrical insulation properties, ozone resistance, flame retardancy and hydrophobicity, etc.

SUMMARY

In view of the ultrahigh heat resistance, yellowing resistance and weather resistance of the organosilicone resin, one of the objects of the present invention is to provide an organosilicone resin composition, and a white prepreg, a laminate and a copper-clad laminate obtained using the organosilicone resin composition having excellent heat resistance, weather resistance and yellowing resistance.

In order to achieve the above object, the present invention adopts the following technical solution:

An organosilicone resin composition, which comprises:
100 parts by weight of a condensation type silicone resin;
5-60 parts by weight of a white filler;
0.0001-2 parts by weight of a catalyst; and
0.1-10 parts by weight of an adjuvant.

The content of the white filler is for example, 8 parts by weight, 12 parts by weight, 16 parts by weight, 20 parts by weight, 24 parts by weight, 28 parts by weight, 32 parts by weight, 36 parts by weight, 40 parts by weight, 44 parts by weight, 48 parts by weight, 52 parts by weight or 56 parts by weight.

The content of the catalyst is for example, 0.0005 part by weight, 0.001 part by weight, 0.005 part by weight, 0.01 part by weight, 0.05 part by weight, 0.1 part by weight, 0.3 part by weight, 0.5 part by weight, 1.0 part by weight, 1.5 parts by weight or 2.0 parts by weight.

The content of the adjuvant is for example, 0.5 part by weight, 1 part by weight, 2 parts by weight, 3 parts by weight, 4 parts by weight, 5 parts by weight, 6 parts by weight, 7 parts by weight, 8 parts by weight or 9 parts by weight.

In the present invention, the condensation type silicone resin is mainly any one or a mixture of at least two of a methyl silicone resin, a methylphenyl silicone resin, or a phenyl silicone resin.

In the present invention, the condensation type silicone resin is any one of dehydration condensation, dealcoholization condensation or dehydrogenation condensation, and the reaction structure thereof is as shown below:

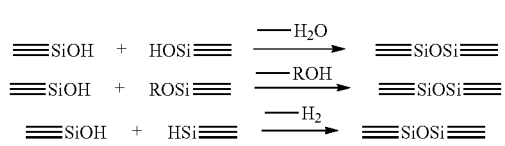

In the present invention, the condensation type silicone resin is any one or a mixture of at least two of a methyl silicone resin, a methylphenyl silicone resin or a phenyl silicone resin with R/Si=1.0-1.7 (molar ratio) (for example, 1.1, 1.2, 1.3, 1.4, 1.5, 1.6 or 1.7) and Ph/(Me+Ph)=0-1.0 (molar ratio) (for example, 0.1, 0.2, 0.3, 0.4, 0.5, 0.6, 0.7, 0.8, 0.9 or 1.0), wherein Ph represents a phenyl group, Me represents a methyl group, and R represents an organic functional group selected from —$CH_3$, -Ph, —$OCH_3$, —$OCH_2CH_3$, —OH or —H. In the condensation type silicone resin, if the R/Si (molar ratio) is too small, and the Ph/Si (molar ratio) is too low, the silicone resin is poor in softness after curing, and the paint film becomes hard, while if the R/Si (molar ratio) is too large, and the Ph/Si (molar ratio) is too high, the laminate is low in hardness, and its curing is slow and the thermosetting property thereof is low. Therefore, the condensation type silicone resin is preferably a methylphenyl silicone resin with R/Si=1.2-1.7 (molar ratio) and Ph/(Me+Ph)=0.2-0.6 (molar ratio).

In the present invention, the white filler is any one or a mixture of at least two of alumina, titanium dioxide, aluminum hydroxide, silica or zinc oxide, preferably titanium dioxide.

According to the present invention, the catalyst is any one or a combination of at least two of zinc naphthenate, tin naphthenate, cobalt naphthenate, iron naphthenate, cerium naphthenate, zinc carboxylate, tin carboxylate, cobalt carboxylate, iron carboxylate, cerium carboxylate, perfluorosulfonic acid, phosphonitrilic chloride, amines, zinc caprylate, zinc isooctanoate, quaternary ammonium bases, titanates or guanidine compounds, etc.

According to the present invention, the adjuvant is a coupling agent and/or a dispersant, and the coupling agent is a silane coupling agent and/or a titanate coupling agent.

Term "comprise(s)" as used in the present invention means that in addition to the described components, other components may be included, which impart different characteristics to the organosilicone resin composition. Besides, term "comprise(s)" as used in the present invention can also be replaced by closed phrase "is (are)" or "consist(s) . . . of".

For example, the organosilicone resin composition may contain various additives. As specific examples, flame retardants, antioxidants, heat stabilizers, antistatic agents, ultraviolet absorbers, pigments, colorants or lubricants, etc. can be listed. These various additives may be used singly or in a combination of two or more.

The second object of the present invention is to provide a resin glue solution which is obtained by dissolving or dispersing the organosilicone resin composition as described above in a solvent.

The solvent used in the present invention is not particularly limited. As specific examples, toluene, xylene, n-hexane, cyclohexane or isopropanol, etc. can be listed.

The third object of the present invention is to provide a white prepreg, which comprises a reinforcing material and the organosilicone resin composition as described above attached to the reinforcing material after impregnation and drying.

The white prepreg of the present invention is polymerized by the condensation reaction through the silicone resin and crosslinked to form a network structure.

The exemplary method for preparing the prepreg is as follows:

The prepreg is obtained by impregnating a reinforcing material such as a flaked fiberglass substrate with the organosilicone resin glue solution made of a condensation type silicone resin, a catalyst, an adjuvant, a white filler, a solvent and optionally other components in, then drying.

The fourth object of the present invention is to provide a white laminate, which comprises at least one white prepreg as described above and is obtained by hot press molding at least one prepreg as described above.

The fifth object of the present invention is to provide a white copper-clad laminate, which comprises at least one laminated white prepreg as described above and a copper foil pressed on one side or both sides of the laminated prepreg.

Compared with the prior art, the present invention has the following beneficial effects:

The present invention utilizes the high heat resistance, excellent weather resistance and UV-irradiation resistance of the organosilicone to replace the disadvantages of the traditional resin such as less heat resistance and ease of yellowing, etc., and by compounding the condensation type silicone resin, the catalyst, the white filler, the adjuvant, and optionally other components, the organosilicone resin composition having excellent heat resistance, weather resistance, and yellowing resistance can be obtained, meanwhile in comparison with the addition type silicone resin, the condensation type silicone resin has better peel strength with the copper foil, when the condensation type silicone resin is applied in the white copper-clad laminate for LED, it will likewise has excellent heat resistance, weather resistance, and yellowing resistance.

In addition, the organosilicone resin in place of the traditional organic resin is used in the white copper-clad laminate for LED in the present invention, which not only can meet the high heat resistance requirements of the LED, but also overcome the shortcomings of the high cost and poor processability of the ceramic substrate, which has been widely applied in the heat dissipation substrate with respect of the thin small LED lighting products, liquid crystal display backlight, etc., and is a new base material for the heat dissipation substrate which is substitutable for the ceramic substrate.

SPECIFIC EMBODIMENTS

The technical solution of the present invention will be further described below by way of specific embodiments.

Example 1

100.0 parts of methyl silicone resin with R/Si=1.1 (molar ratio) and Ph/(Ph+Me)=0 (molar ratio) was weighed and dissolved in 100.0 parts of toluene solvent, after it was dissolved completely, 0.003 part of zinc caprylate catalyst and 0.5 part of silane coupling agent γ-glycidyloxypropyltrimethoxysilane (manufactured by Dow Corning Co., Ltd., U.S.A.) were measured with a precise pipette into the silicone resin solution, after the mixture was stirred uniformly, 5.5 parts of white pigment rutile type titanium dioxide was added, then the mixture was stirred at room temperature for 1 hour, emulsified for 20 minutes to obtain a white silicone resin glue solution.

A glass fiber cloth having a weight of 104 g/cm² was impregnated with this white silicone resin varnish, then dried at 110° C. for 10 minutes to obtain a prepreg having a resin content of 58%. 8 prepregs were laminated, 35 μm of electrolytic copper foil was provided on the upper and lower surfaces of the laminate respectively, which was pressure-molded at 200° C., a surface pressure of 30 kgf/cm² and 30 mmHg or less of vacuum for 120 minutes to obtain a double-sided copper-clad laminate having a thickness of 1.0 mm.

Example 2

100.0 parts of methylphenyl silicone resin with R/Si=1.5 (molar ratio) and Ph/(Ph+Me)=0.4 (molar ratio) was weighed and dissolved in 100.0 parts of toluene solvent, after it was dissolved completely, 0.005 part of cobalt acetylacetonate catalyst and 1.2 parts of γ-glycidyloxypropyltrimethoxysilane (manufactured by Dow Corning Co., Ltd., U.S.A.) were measured with a precise pipette into the silicone resin solution, after the mixture was stirred uniformly, 30 parts of white pigment rutile type titanium dioxide was added, then the mixture was stirred at room temperature for 1 hour, emulsified for 20 minutes to obtain the white silicone resin glue solution.

A prepreg and a double-sided copper-clad laminate having a thickness of 1.0 mm were obtained in the same manner as that in Example 1 except that the resin glue solution prepared above was used.

Example 3

100.0 parts of methylphenyl silicone resin with R/Si=1.6 (molar ratio) and Ph/(Ph+Me)=0.8 (molar ratio) was weighed and dissolved in 100.0 parts of toluene solvent, after it was dissolved completely, 0.1 part of aluminum naphthenate catalyst and 1.8 parts of W-903 (manufactured by BYK Company, Germany) were measured with a precise pipette into the silicone resin solution, after the mixture was stirred uniformly, 25 parts of white pigment anatase type titanium dioxide and 10 parts of silica filler were added, then the mixture was stirred at room temperature for 1 hour, emulsified for 20 minutes to obtain the white silicone resin glue solution.

A prepreg and a double-sided copper-clad laminate having a thickness of 1.0 mm were obtained in the same manner as that in Example 1 except that the resin glue solution prepared above was used.

Example 4

100.0 parts of phenyl silicone resin with R/Si=1.7 (molar ratio) and Ph/(Ph+Me)=1.0 (molar ratio) was weighed and dissolved in 100.0 parts of toluene solvent, after it was dissolved completely, 0.1 part of aluminum naphthenate catalyst and 6.8 parts of W-903 (manufactured by BYK Company, Germany) were measured with a precise pipette into the silicone resin solution, after the mixture was stirred uniformly, 25 parts of white pigment anatase type titanium dioxide and 35 parts of alumina filler were added, then the mixture was stirred at room temperature for 1 hour, emulsified for 20 minutes to obtain the white silicone resin glue solution.

A prepreg and a double-sided copper-clad laminate having a thickness of 1.0 mm were obtained in the same manner as that in Example 1 except that the resin glue solution prepared above was used.

Example 5

50.0 parts of methyl silicone resin with R/Si=1.1 (molar ratio) and Ph/(Ph+Me)=0 (molar ratio) and 50.0 parts of methylphenyl silicone resin with R/Si=1.7 (molar ratio) and Ph/(Ph+Me)=0.9 (molar ratio) were weighed and dissolved in 100.0 parts of toluene solvent, after it was dissolved completely, 1.8 parts of titanate catalyst and 1.8 parts of W-903 dispersant (manufactured by BYK Company, Germany) were measured with a precise pipette into the silicone resin solution, after the mixture was stirred uniformly, 25 parts of white pigment anatase type titanium dioxide and 35 parts of silica filler were added, then the mixture was stirred at room temperature for 1 hour, emulsified for 20 minutes to obtain the white silicone resin glue solution.

A prepreg and a double-sided copper-clad laminate having a thickness of 1.0 mm were obtained in the same manner as that in Example 1 except that the resin glue solution prepared above was used.

Comparative Example 1

100 parts of methylvinyl silicone resin (the mass fraction of vinyl of 1.0%) was weighed and dissolved into 50 parts of methyl vinyl silicone oil having a viscosity of 500 mPa·s, then 2.9 parts of methyl hydrogen silicone oil (the mass fraction of the hydrogen contained therein of 1.3%) was added after uniformly dissolved, 0.001 part of hexynol was weighed after uniformly stirring under high speed, then 0.01 part of platinum-methylphenyl vinyl complex was added after stirring for 30 minutes, 30 parts of white pigment rutile type titanium dioxide was added after continuously stirring for 30 minutes, then the mixture was stirred at room temperature for 1 hour, emulsified for 20 minutes to obtain the white addition type silicone resin glue solution.

A prepreg and a double-sided copper-clad laminate having a thickness of 1.0 mm were obtained in the same manner as that in Example 1 except that the resin glue solution prepared above was used.

Comparative Example 2

100.0 parts of methyl silicone resin with R/Si=1.1 (molar ratio) and Ph/(Ph+Me)=0 (molar ratio) was weighed and dissolved in 100.0 parts of toluene solvent, after it was dissolved completely, 0.003 part of zinc caprylate catalyst and 0.5 part of silane coupling agent γ-glycidyloxypropyltrimethoxysilane (manufactured by Dow Corning Co., Ltd., U.S.A.) were measured with a precise pipette into the silicone resin solution, after the mixture was stirred uniformly, 2.5 parts of white pigment type rutile type titanium dioxide was added, then the mixture was stirred at room temperature for 1 hour, emulsified for 20 minutes to obtain the white silicone resin glue solution.

A prepreg and a double-sided copper-clad laminate having a thickness of 1.0 mm were obtained in the same manner as that in Example 1 except that the resin glue solution prepared above was used.

Comparative Example 3

100.0 parts of methylphenyl silicone resin with R/Si=1.6 (molar ratio) and Ph/(Ph+Me)=0.8 (molar ratio) was weighed and dissolved in 100.0 parts of toluene solvent, after it was dissolved completely, 0.1 part of aluminum naphthenate catalyst and 1.8 parts of W-903 (manufactured by BYK Company, Germany) were measured with a precise pipette into the silicone resin solution, after the mixture was stirred uniformly, 65 parts of white pigment anatase type titanium dioxide and 10 parts of silica filler were added, then the mixture was stirred at room temperature for 1 hour, emulsified for 20 minutes to obtain the white silicone resin glue solution.

A prepreg and a double-sided copper-clad laminate having a thickness of 1.0 mm were obtained in the same manner as that in Example 1 except that the resin glue solution prepared above was used.

Comparative Example 4

100.0 parts of methylphenyl silicone resin with R/Si=1.8 (molar ratio) and Ph/(Ph+Me)=0.8 (molar ratio) was weighed and dissolved in 100.0 parts of toluene solvent, after it was dissolved completely, 0.1 part of aluminum naphthenate catalyst and 1.8 parts of W-903 (manufactured by BYK Company, Germany) were measured with a precise pipette into the silicone resin solution, after the mixture was stirred uniformly, 25 parts of white pigment anatase type titanium dioxide and 10 parts of silica filler were added, then the mixture was stirred at room temperature for 1 hour, emulsified for 20 minutes to obtain the white silicone resin glue solution.

A prepreg and a double-sided copper-clad laminate having a thickness of 1.0 mm were obtained in the same manner as that in Example 1 except that the resin glue solution prepared above was used.

into a size of 100 mm×100 mm and subjected to the etching treatment to obtain respective organosilicone white laminates, which were baked at 200° C. for a long period of time, the reflectivities of which were compared, and the data were as shown in the table below.

(2) Heat-Resistant Stability

The copper-clad laminates of Examples 1-5 and Comparative Examples 1-4 were subjected to the etching treatment to obtain respective laminates, and the thermal decomposition temperature of the laminate substrate was measured by thermogravimetric analysis (TGA), and the temperature Td (2%) at which the decomposition was 2% was shown in the table below.

Test equipment: NETZSCH TG209F3

Test conditions: from room temperature to 700° C., the heating rate could be controlled at 10° C.±0.1° C./min, and the flow rate of nitrogen was 0.9 ml/s.

(3) Peel Strength Test

Test method: Method IPC-TM-6502.4.8 was used for the test, and the test data were shown in the table below.

|  |  | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|---|
| Methylphenyl silicone resin | | — | 100 | 100 | — | 50 | — | — | 100 | 100 |
| Methyl silicone resin | | 100 | — | — | — | 50 | — | 100 | — | — |
| Phenyl silicone resin | | — | — | — | 100 | — | — | — | — | — |
| Methylvinyl silicone resin | | — | — | — | — | — | 100 | — | — | — |
| R/Si | | 1.1 | 1.5 | 1.6 | 1.7 | 1.1/1.7 | — | 1.1 | 1.6 | 1.8 |
| Ph/(Me + Ph) | | 0 | 0.4 | 0.8 | 1.0 | 0/0.9 | — | 0 | 0.8 | 0.8 |
| Rutile type titanium dioxide | | 5.5 | 30 | — | — | — | 30 | 2.5 | — | — |
| Anatase type titanium dioxide | | — | — | 25 | 25 | 25 | — | — | 65 | 25 |
| Silica | | — | — | 10 | — | 35 | — | — | 10 | 10 |
| Alumina | | — | — | 35 | — | — | — | — | — | — |
| Test results | | | | | | | | | | |
| Heat discoloration resistance Reflectivity % | Before baking | 88.2 | 89.5 | 88.9 | 89.2 | 90.0 | 88.3 | 79.1 | 88.4 | 88.7 |
| | Baking for 24 h | 88.1 | 89.2 | 88.6 | 88.3 | 86.7 | 85.0 | 78.6 | 88.6 | 88.1 |
| | Baking for 72 h | 87.4 | 88.7 | 88.2 | 85.4 | 86.7 | 80.7 | 75.3 | 85.4 | 85.3 |
| | Baking for 120 h | 86.6 | 88.1 | 87.3 | 84.9 | 86.2 | 75.5 | 74.5 | 84.8 | 84.6 |
| Heat-resistant stability (Temperature at which the decomposition was 2%)° C. | | 601.3 | 621.7 | 686.9 | 594.2 | 598.5 | 389.4 | 576.3 | 596.7 | 456.2 |
| Peel strength test N/mm | | 0.58 | 0.61 | 0.65 | 0.56 | 0.56 | 0.41 | 0.54 | 0.27 | 0.50 |

Effect Confirmation Test:

(1) Heat Discoloration Resistance

The copper-clad white laminates obtained in Examples 1-5 and Comparative Examples 1-4 were cut with a dicing saw, and the double-sided copper-clad laminates were cut Analysis of physical properties: As can be seen from the data in the above table, Examples 1-5 have good optical reflectivity at room temperature and maintains very good optical reflectivity even if baked in the long term at high temperature, meanwhile they have better stability at high temperature, and higher peel strength, which can fully meet the requirements of LED white laminates. When Comparative Example 1 was compared with Example 2, since the resin was the methylvinyl silicone resin, and an addition type curing method was used, the copper-clad laminate had poor reflectivity at high temperature, poor high temperature resistance and poor peel strength; when Comparative Example 2 was compared with Example 1, since the content of the white filler is less, their reflectivities at both room temperature and high temperature were poor; when Comparative Example 3 was compared with Example 3, since the content of the white filler was out of range, the peel strength with the copper foil was lowered and it failed to be used properly; when Comparative Example 4 was compared with Example 3, R/Si was very high, resulting in the board being soft and incomplete curing, thus the heat resistance was poor.

Applicant has stated that although the detailed methods of the present invention have been described by the above embodiments in the present invention, the present invention is not limited to the detailed methods described above, that is to say, it is not meant that the present invention has to be implemented depending on the above detailed methods. It will be apparent to those skilled in the art that any improvements made to the present invention, equivalent replacements to the raw materials of the products of the present invention and addition of adjuvant ingredients, and selections of the specific implementations, etc., all fall within the protection scope and the disclosure scope of the present invention.

The invention claimed is:

1. A white prepreg comprising a reinforcing material and a silicone resin composition comprising an organosilicone resin composition, wherein the organosilicone resin composition consists of the following components:
   100 parts by weight of a condensation type silicone resin;
   5-60 parts by weight of a white filler;
   0.0001-2 parts by weight of a catalyst; and
   0.1-10 parts by weight of an adjuvant;
   wherein the condensation type silicone resin is a methylphenyl silicone resin with R/Si=1.2-1.7 (molar ratio) and Ph/(Me+Ph)=0.2-0.6 (molar ratio),
   wherein the white filler is any one or a mixture of at least two of alumina, titanium dioxide, aluminum hydroxide, silica or zinc oxide, and
   wherein the silicone resin composition is attached to the reinforcing material after impregnation and drying.

2. The white prepreg of claim 1, wherein the catalyst is any one or a combination of at least two of zinc naphthenate, tin naphthenate, cobalt naphthenate, iron naphthenate, cerium naphthenate, zinc carboxylate, tin carboxylate, cobalt carboxylate, iron carboxylate, cerium carboxylate, perfluorosulfonic acid, phosphonitrilic chloride, amine, zinc caprylate, zinc isooctanoate, quaternary ammonium base, titanate or guanidine compound.

3. A white laminate, wherein the white laminate comprises at least one white prepreg according to claim 1.

4. A white copper-clad laminate, wherein the white copper-clad laminate comprises at least one laminated white prepreg according to claim 1 and a copper foil pressed on one side or both sides of the laminated prepreg.

5. The white prepreg of claim 1, wherein the adjuvant is a coupling agent and/or a dispersant, and the coupling agent is a silane coupling agent and/or a titanate coupling agent.

* * * * *